United States Patent
Butler

(10) Patent No.: US 6,337,278 B1
(45) Date of Patent: Jan. 8, 2002

(54) TECHNIQUE FOR FORMING A BORDERLESS OVERLAPPING GATE AND DIFFUSION CONTACT STRUCTURE IN INTEGRATED CIRCUIT DEVICE PROCESSING

(75) Inventor: Douglas Blaine Butler, Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/644,346

(22) Filed: Aug. 23, 2000

(51) Int. Cl.$^7$ .................................... H01L 21/302
(52) U.S. Cl. .................. 438/689; 438/722; 438/723; 438/743; 438/744
(58) Field of Search ................... 438/689, 723, 438/724, 743, 744

(56) References Cited

U.S. PATENT DOCUMENTS

| | | | |
|---|---|---|---|
| 4,966,870 A | 10/1990 | Barber et al. | 437/228 |
| 5,043,790 A | 8/1991 | Butler | 357/68 |
| 5,104,822 A | 4/1992 | Butler | 437/52 |
| 5,216,281 A | 6/1993 | Butler | 257/750 |
| 5,385,634 A | 1/1995 | Butler et al. | 156/644 |
| 5,652,176 A | 7/1997 | Maniar et al. | 437/67 |
| 5,674,781 A | 10/1997 | Huang et al. | 437/192 |
| 5,928,967 A | 7/1999 | Radens et al. | 438/740 |

Primary Examiner—Robert Kunemund
Assistant Examiner—Lynette T. Umez-Eronini
(74) Attorney, Agent, or Firm—William J. Kubida; Hogan & Hartson LLP

(57) ABSTRACT

A technique for forming a borderless transistor gate and source/drain region contact structure which provides an on-chip area efficient layout and connection between the device gate layer and an associated source/drain region that can also overlap adjoining isolation structures. In a representative embodiment, this may be effectuated through the overlapping of one portion of the contact region over the edge of the gate polysilicon layer and another part of the contact over the source/drain diffusion. The structure and process of the present invention provides a desirable size reduction in the contact for given design rule dimensions and the resultant contact structure is inherently "self-aligned" to both the gate polysilicon layer and the isolation region in that the contact has no need for an interstitial space between it and the gate polysilicon or isolation regions to prevent unintended electrical connections.

7 Claims, 4 Drawing Sheets

TECHNIQUE FOR FORMING A BORDERLESS OVERLAPPING GATE AND DIFFUSION CONTACT STRUCTURE IN INTEGRATED CIRCUIT DEVICE PROCESSING

BACKGROUND OF THE INVENTION

The present invention relates, in general, to the field of integrated circuit ("IC") device structure and processing. More particularly, the present invention relates to a borderless transistor gate and source/drain region contact structure and processing technique of especial utility in providing an on-chip area efficient connection between the device gate layer and an associated source/drain region that can also overlap adjoining isolation structures. In a representative embodiment disclosed herein, such may be effectuated through the overlapping of one portion of the contact region over the edge of the gate polysilicon layer and another part of the contact over the source/drain diffusion.

A number of processing techniques have been described for the formation of contacts between the polysilicon interconnect layer of metal oxide semiconductor ("MOS") transistor gates and an associated source/drain diffusion. Representative of these are U.S. Pat. No. 4,966,870 to Barber et al. for "Method for Making Borderless Contacts"; U.S. Pat. No. 5,043,790 to Butler for "Sealed Self Aligned Contacts Using Two Nitrides Process"; U.S. Pat. No. 5,104,822 to Butler for "Method for Creating Self-Aligned, Non-Patterned Contact Areas and Stacked Capacitors Using the Method"; U.S. Pat. No. 5,216,281 to Butler for "Self Sealed Aligned Contact Incorporating a Dopant Source"; U.S. Pat. No. 5,385,634 to Butler et al. for "Sealed Self Aligned Contact Process"; U.S. Pat. No. 5,652,176 to Maniar et al. for "Method for Providing Trench Isolation and Borderless Contact"; U.S. Pat. No. 5,674,781 to Huang et al. for "Landing Pad Technology Doubled Up as a Local Interconnect and Borderless Contact for Deep Sub-Half Micrometer IC Application"; and U.S. Pat. No. 5,928,967 to Radens et al. for "Selective Oxide-to-Nitride Etch Process Using $C_4F_8$/CO/AR". None of the techniques described in the aforementioned patents allow for the formation of a dual contact from a gate polysilicon layer to an associated diffusion that could also overlap adjoining isolation structures.

SUMMARY OF THE INVENTION

Disclosed herein is a borderless transistor gate and source/drain region contact structure and processing technique which provides an on-chip area efficient layout and connection between the device gate layer and an associated source/drain region that can also overlap adjoining isolation structures. In a representative embodiment disclosed herein, this is effectuated through the overlapping of one portion of the contact region over the edge of the gate polysilicon layer and another part of the contact over the source/drain diffusion.

Advantageously, the structure and process of the present invention provides a desirable size reduction in the contact for a given design rule dimension. The contact provided hereby is inherently "self-aligned" to both the gate polysilicon layer and the isolation region in that the contact has no need for an interstitial space between it and the gate polysilicon or isolation regions to prevent unintended electrical connections thereto. In the latter instance, the unwanted connection would be to the semiconductor bulk, or substrate.

Particularly disclosed herein is a method for forming an electrical contact to at least one switching device forming a portion of an integrated circuit device wherein the switching device comprises a pair of substantially coplanar, spaced apart source and drain regions formed in a substrate having a gate terminal insulatedly disposed between the source and drain regions overlying the substrate. The method comprises the steps of: forming an insulating layer overlying the gate terminal proximate to the source and drain regions; forming an antireflective layer overlying the insulating layer and the source and drain regions, with the antireflective layer having a first thickness overlying the insulating layer and a second greater thickness overlying the source, drain and isolation regions. The antireflective layer overlying the insulating layer which overlies the gate terminal is removed to a first thickness thereof and at least a portion of said second thickness of the antireflective layer overlying one of the source or drain regions is also removed by an amount substantially equivalent to the first thickness to provide a remaining third intermediate thickness thereof. The insulating layer overlying the gate terminal is selectively removed to expose an upper surface thereof without substantially removing the third intermediate thickness of the antireflective coating. The process further includes the steps of: removing the third thickness of the antireflective coating layer to expose an upper surface of one of the source or drain regions; forming at least one additional layer at least overlying remaining portions of the insulating layer overlying the gate terminal, the upper surface of the gate layer and the upper surface of one of the source or drain regions; removing a portion of the additional layer to provide an aperture formed therein at least overlying the upper surfaces of the gate terminal and one of the source or drain regions and forming the electrical contact to the gate terminal and the source of drain region within the aperture.

Also disclosed herein is a method for forming an electrical contact to at least one switching device forming a portion of an integrated circuit device wherein the switching device includes a pair of substantially coplanar spaced apart source and drain regions formed in a substrate has a gate terminal insulatedly disposed between the source and drain regions overlying the substrate. The gate terminal and an adjacent conductive region disposed laterally of one of the source and drain regions are covered by respective first and second isolation structures. The method includes the steps of: forming a photoresist layer overlying an upper surface of the integrated circuit device; forming an opening in the photoresist layer overlying at least a portion of the gate terminal and one of the source and drain regions; removing a portion of the first isolation structure overlying at least a portion of an upper surface of the gate terminal within the opening and exposing an upper surface of one of the source and drain regions; removing the photoresist layer; forming at least one additional layer overlying the upper surface of the integrated circuit device including the portion of the upper surface of the gate terminal and the upper surface of one of the source and drain regions; forming an aperture in the additional layer to expose at least the portion of the upper surface of the gate terminal, the upper surface of one of the source and drain regions and at least a portion of an upper surface of the second isolation structure; and forming the electrical contact to the gate terminal and one of the source and drain regions within the aperture.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1A:
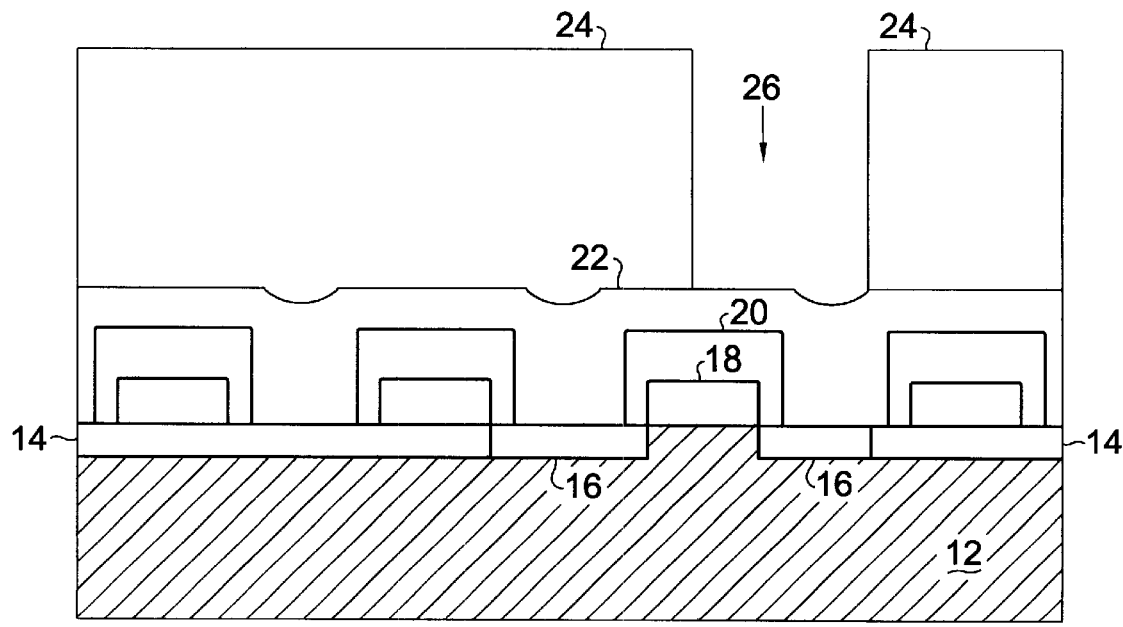
FIG. 1A is a simplified cross-sectional view of a portion of an integrated circuit device showing at least one MOS transistor comprising a polysilicon gate layer and associated source/drain regions during fabrication of the device with an overlying layer of photoresist into which an opening has been formed by exposure, development and removal of a portion of the photoresist to form the nitride removal ("NR") opening.

With reference now to FIG. 1A, a simplified cross-sectional view of a portion of an integrated circuit device 10 is shown. The integrated circuit device 10 comprises a substrate (or bulk) 12 in which a number of field oxide regions 14 have been provided. At least one MOS transistor is disposed between the field oxide regions 14 comprising associated source/drain regions 16 and a gate polysilicon layer 18. The gate polysilicon layer 18 overlies a thin gate oxide layer formed on an upper surface of the substrate 12 (not shown). A silicon nitride (or silicon dioxide) layer 20 overlies and surrounds the gate polysilicon layer 18 of the active device as well as other polysilicon regions which may overlay the field oxide regions 14 or the substrate 12.

A non-conformal layer such as an antireflective coating layer 22 is produced overlying the nitride layer 20 in addition to the field oxide regions 14 and source/drain diffusions 16. As shown, a photoresist layer 24 is applied overlying the antireflective coating layer 22 and it is then patterned such that an opening 26 has been formed therein. At this stage, the opening 26 in the photoresist layer 24 extends only to the upper surface of the antireflective coating layer 22.

Figure 1B:
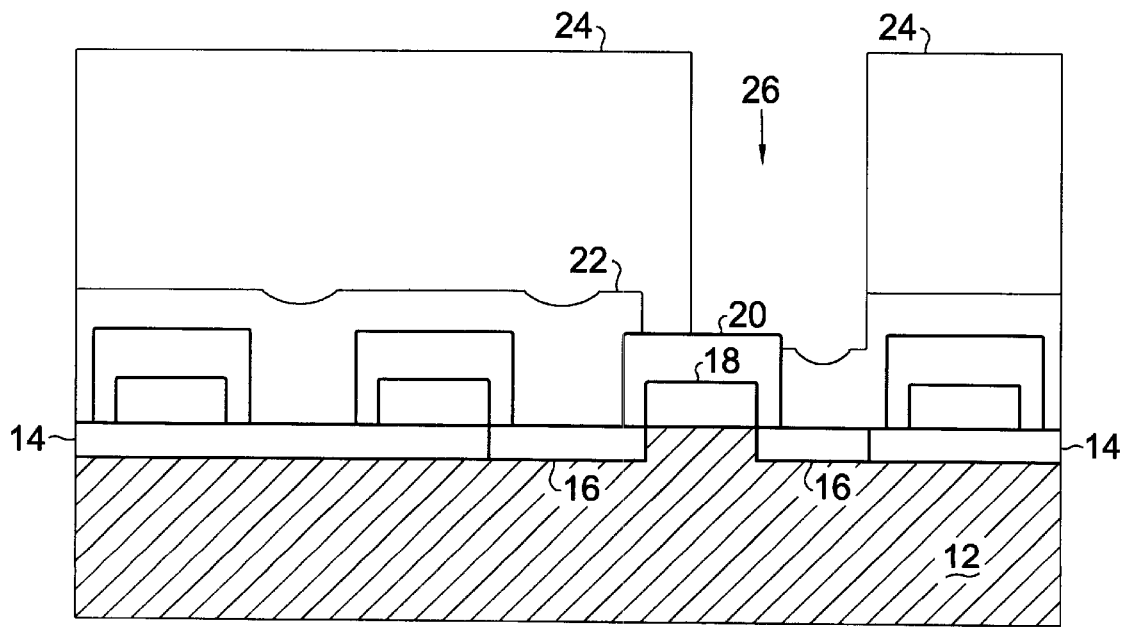
FIG. 1B is a follow-on cross-sectional view of the same portion of the integrated circuit device following an etch operation to remove a portion of the antireflective coating exposed by the NR opening in the photoresist layer.

With reference additionally now to FIG. 1B, a follow-on cross-sectional view of the same portion of the integrated circuit device 10 is shown following an etch operation to remove a portion of the antireflective coating layer 22 through the NR opening 26 in the photoresist layer 24. With respect to this figure, like structure to that previously described and illustrated with respect to the preceding figure has been like numbered. At this point in the process sequence, the upper surface of the nitride layer 20 has been exposed within the NR opening 26 in addition to a portion of the nitride layer 20 sidewall.

Figure 1C:
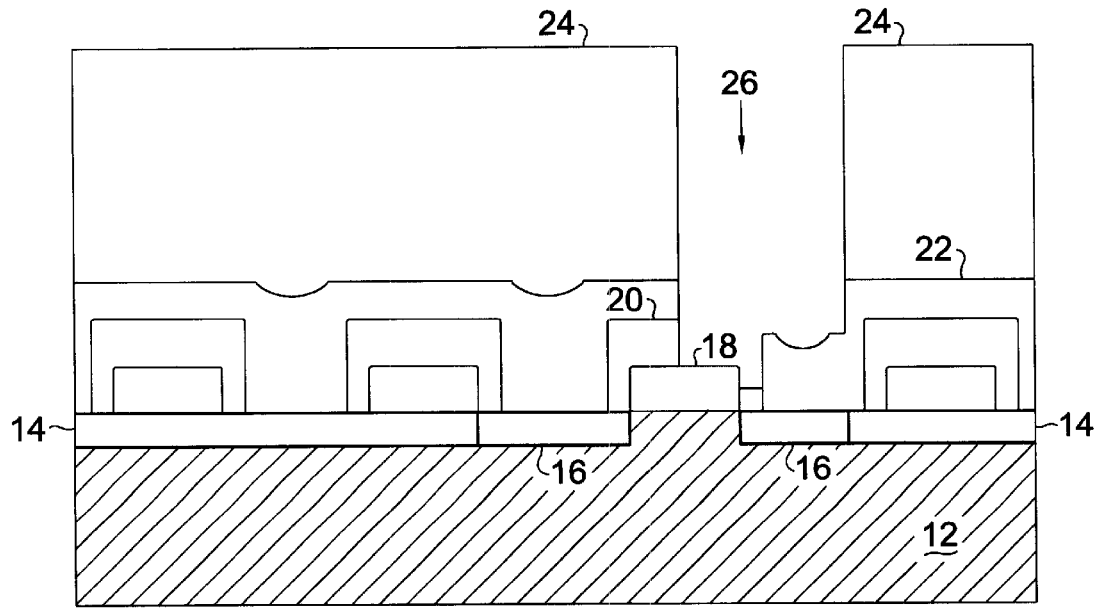
FIG. 1C is an additional follow-on cross-sectional view of the integrated circuit device portion of the preceding figures illustrating a nitride etch step within the photoresist opening to remove a portion of the nitride overlying and surrounding the polysilicon gate layer.

With reference additionally now to FIG. 1C, an additional follow-on cross-sectional view of the portion of the integrated circuit device 10 of the preceding figures is shown illustrating a subsequent nitride etch step within the photoresist layer 24 opening 26 to remove a portion of the nitride layer 20 overlying a portion of the upper surface and part of one side of the polysilicon gate layer 18. With respect to this figure, like structure to that previously described and illustrated with respect to the preceding figures has been like numbered.

Figure 1D:
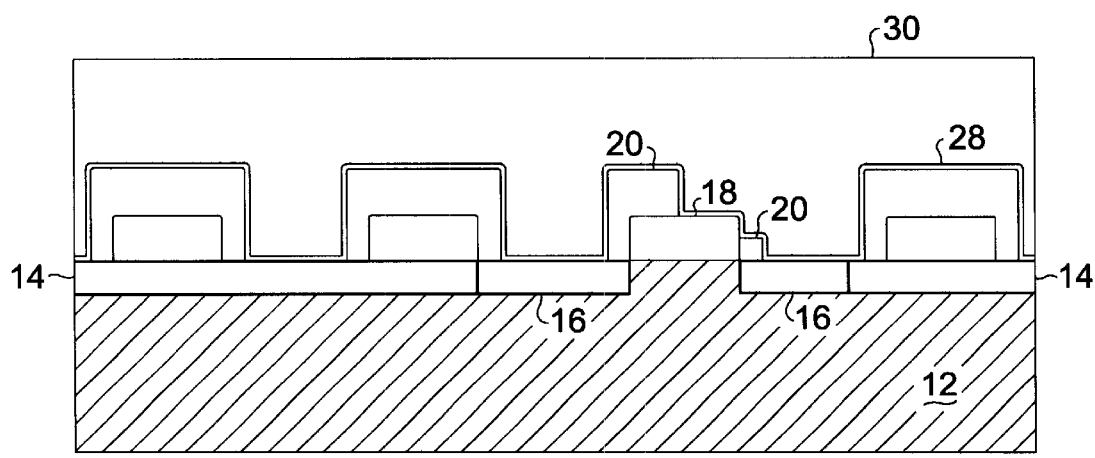
FIG. 1D is a further follow-on cross-sectional view of the portion of the integrated circuit device of the preceding figures following stripping of the photoresist layer and removal of the antireflective coating and a subsequent oxynitride deposition, chemical mechanical polishing ("CMP") and oxide deposition steps.

With reference additionally now to FIG. 1D, a further follow-on cross-sectional view of the portion of the integrated circuit device 10 of the preceding figures is shown following stripping of the photoresist layer 24 and removal of the antireflective coating layer 22 and a subsequent oxynitride (or silicon nitride) deposition to form a first layer 28, chemical mechanical polishing ("CMP") and oxide deposition steps to form a second oxide layer 30 overlying the oxynitride layer 28. Again, like structure to that previously described and illustrated with respect to the preceding figures has been like numbered.

Figure 1E:
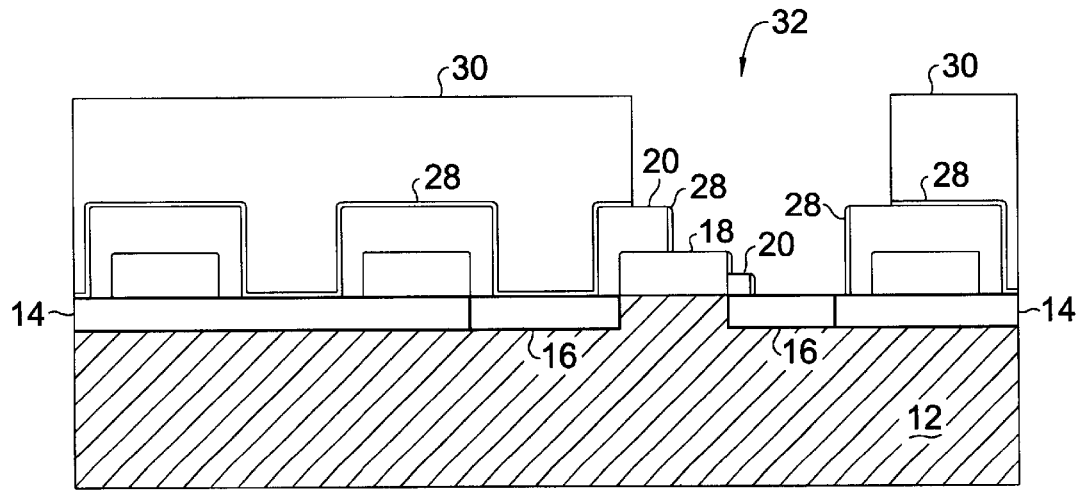
FIG. 1E is another follow-on cross-sectional view of the portion of the integrated circuit device shown in the preceding figures wherein an opening in the oxide/oxynitride layers has been formed following a contact photoresist patterning step, contact etch and oxynitride strip operations and wherein a borderless overlapping gate and diffusion contact structure in accordance with the present invention may be formed.

With reference additionally now to FIG. 1E, another follow-on cross-sectional view of the portion of the integrated circuit device 10 shown in the preceding figures is illustrated wherein an opening 32 in the oxide/oxynitride layers 30, 28 has been formed following a contact photoresist patterning step, contact etch and oxynitride etch operations (to remove those portions of the oxynitride layer 28 overlying at least a portion of the upper surfaces of the gate layer 18 and exposed a portion of one of the source/drain regions 16) and wherein a borderless overlapping gate and diffusion contact structure in accordance with the present invention may be formed. As before, like structure to that previously described and illustrated with respect to the preceding figures has been like numbered.

Figure 1F:
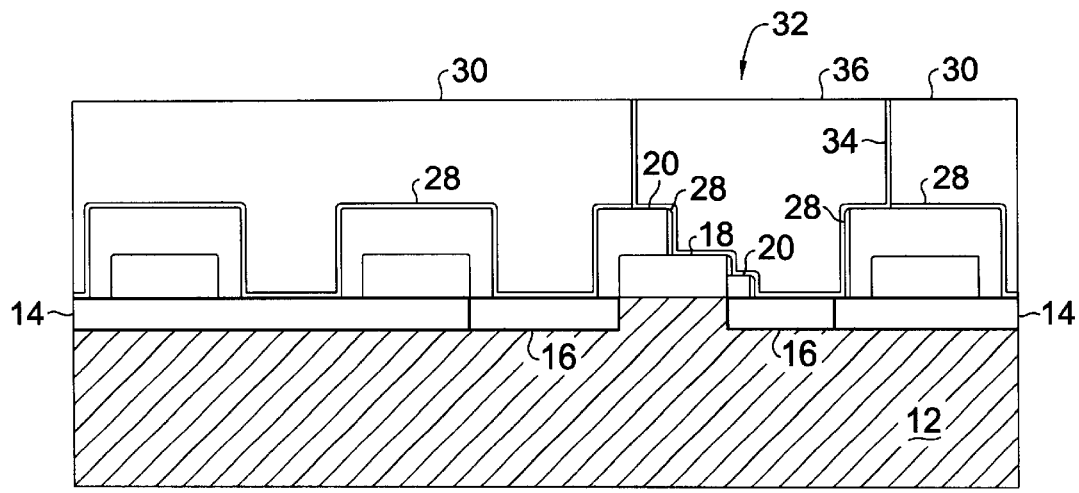
FIG. 1F is a further follow-on cross-sectional view of the portion of the integrated circuit device shown in the preceding figures following deposition of a titanium-tungsten (TiW) barrier layer, deposition of an overlying tungsten (W) layer and a chemical-mechanical polishing ("CMP") operation for removal of the tungsten layer and titanium-tungsten barrier layer outside of the contact opening.

With reference additionally now to FIG. 1F, a further follow-on cross-sectional view of the portion of the integrated circuit device shown in the preceding figures is illustrated. In this figure, a titanium-tungsten (TiW) barrier layer 34 has been deposited overlaying the upper surface of the oxide layer 30 as well as along the exposed surfaces within the opening 32. A tungsten (W) layer 36 is then deposited overlying the titanium-tungsten layer to a depth sufficient to fill the remaining volume of the opening 32. This is then followed by a chemical-mechanical polishing ("CMP") operation to remove the tungsten layer 36 and titanium-tungsten barrier layer 34 outside of the contact opening 32.

Figure 2:
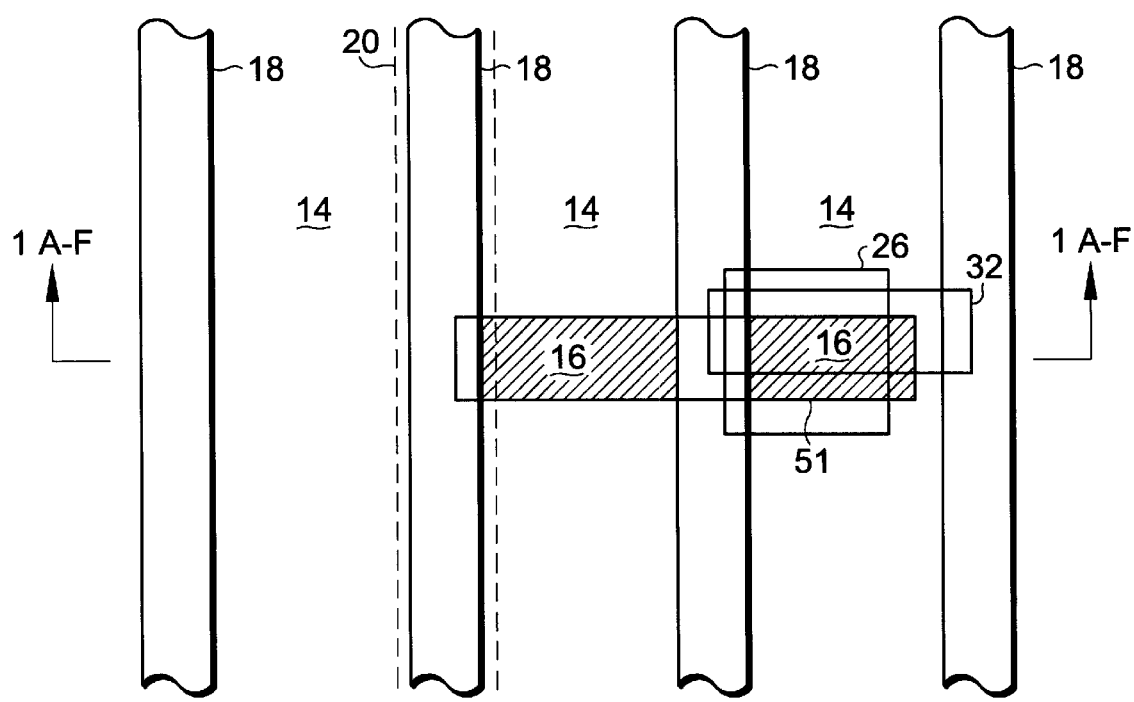
FIG. 2 is a top plan view of a corresponding portion of an integrated circuit device formed in accordance with the process of the preceding FIGS. to provide a borderless overlapping gate and diffusion contact structure in accordance with the present invention.

With reference additionally now to FIG. 2, a top plan view of a corresponding portion of an integrated circuit device 50, is shown incorporating a borderless overlapping gate and diffusion contact structure 32 in accordance with the present invention. With respect to this figure, any region not forming a portion of the active region is an isolation region.

The contact structure 32 illustrated is a dual contact and connects one of the gate polysilicon layers 18 to one of the source/drain diffusion layers 16. Any active area 51 not covered by the gate polysilicon layer 18 will be source/drain diffusion layer 16. The NR pattern 26 that overlaps the dual contact structures 32 is opened in the photoresist layer 24 (FIGS. 1A–1C) as previously described and the nitride covering the gate polysilicon layer 18 is etched away before the oxynitride layer used to achieve self-alignment of the contact structure 32 to the isolation region 14 is deposited. As a result, any intersection of the contact structure 32 NR pattern 26 and gate polysilicon layer 18 will result in a connection of metal to the gate polysilicon layer 18. At the same time, an intersection of (i.e., an overlapping region of) the contact structure 32 and gate polysilicon layer 18 without the NR pattern 26 will not result in a gate polysilicon layer 18 to metal connection.

In accordance with one method of practicing the present invention it is possible to expose the nitride layer 20 over the gate polysilicon layer 18 (FIGS. 1A–1E), and only that nitride layer 20, to an etch process is to utilize the fact that the antireflective layer 22 coatings that are spin-coated onto a wafer surface are much thicker between gate polysilicon layer 18 features than on top of them. After the NR pattern 26 is developed, a timed etch of the antireflective layer 22 coating material is done such that the nitride layer 20 covering gate polysilicon layer 18 in the NR opening 26 is exposed but none of the source, drain regions 16 or isolation region 14 are exposed. The contact structures 32 remain self-aligned to isolation in the same manner as other non-dual contacts by using a contact etch that stops at the oxynitride layer 28 then doing a short etch that removes the oxynitride layer 28 in the opening 30 but does not remove the field (or trench) oxide. Since the nitride layer 20 on top of the gate polysilicon layer 18, and only that nitride, is etched during the NR patterning step, self-alignment to isolation is not changed by the NR pattern 26. In accordance with the present invention, it is clear that contact can be made to one gate polysilicon layer 18 trace while not contacting an adjacent gate polysilicon trace (the rightmost) even though the contact structure overlaps both traces.

What has been provided, therefore, is an area efficient connection between a gate polysilicon layer (or tungsten-silicide (WSi)) interconnect layer and a source/drain diffusion by overlapping a contact region over the edge of gate polysilicon layer such that part of the contact is on the gate polysilicon and part of the contact is on the source/drain diffusion. This contact structure is most area efficient if it can be "self-aligned" to both the gate polysilicon and the isolation region, that is, there is no need for a space to gate polysilicon or to the isolation regions to prevent unwanted electrical connection to them.

While there have been described above the principles of the present invention in conjunction with specific device structures and processing steps, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for forming an electrical contact from the gate to the source or drain of an integrated circuit transistor, said integrated circuit transistor comprising a pair of substantially coplanar spaced apart source and drain regions formed in the substrate of said integrated circuit and having a gate terminal insulatedly disposed between said source and drain regions overlying said substrate, said gate terminal having a first insulating layer overlying said gate terminal, said source and drain regions bounded by said gate terminal and isolation regions, said method comprising:

forming a non-conformal layer overlying said integrated circuit, said non-conformal layer having a first thickness overlying said first insulating layer and a second greater thickness overlying said source, drain and isolation regions;

forming a first photoresist layer overlying an upper surface of said integrated circuit;

forming an opening in said first photoresist layer overlying at least a portion of said gate terminal and a portion of said source and drain regions and a portion of said isolation region;

etching said non-conformal layer exposed by said opening in said first photoresist layer to an extent to expose said first insulating layer but to not expose said source and drain and isolation regions;

etching said exposed first insulating layer to create an exposed region of said gate terminal;

removing said first photoresist and non-conformal layer;

forming a conformal etch stop layer over said integrated circuit;

forming a second insulating layer over said integrated circuit;

forming a second photoresist layer overlying an upper surface of said integrated circuit;

forming another opening in said second photoresist layer overlying at least a portion of said exposed region of said gate terminal and a portion of said source and drain region and a portion of said isolation region;

etching said second insulating layer exposed by said another opening in said second photoresist layer while leaving said etch stop layer substantially unetched;

removing said second photoresist layer;

etching said etch stop layer exposed by said etching of said second insulating layer; and depositing a conductive layer thereby connecting said gate terminal to one of said source or drain regions.

2. The method of claim 1 wherein said first insulating layer comprises silicon nitride.

3. The method of claim 1 wherein said first insulating layer comprises silicon dioxide.

4. The method of claim 1 wherein said step of depositing said conductive layer is carried out by the step of:

forming a conductor within said another opening.

5. The method of claim 4 wherein said step of forming said conductor within said another opening is carried out by the step of:

depositing a barrier layer within said another opening; and depositing a conductive layer overlying said barrier layer within said another opening.

6. The method of claim 5 wherein said steps of depositing a barrier layer within said another opening and depositing a conductive layer overlying said barrier layer are respectively carried out by the steps of:

depositing a titanium-tungsten layer within said another opening; and depositing a tungsten layer overlying said titanium-tungsten layer within said another opening.

7. The method of claim 1 wherein said step of forming a non-conformal layer an antireflective layer.

UNITED STATES PATENT AND TRADEMARK OFFICE
CERTIFICATE OF CORRECTION

PATENT NO.    : 6,337,278 B1                                                Page 1 of 1
DATED         : January 8, 2002
INVENTOR(S)   : Douglas Blaine Butler It is certified that error appears in the above-identified patent and that said Letters Patent is hereby corrected as shown below:

<u>Column 8,</u>
Line 4, after non-conformal layer, should read -- comprises the step of providing --

Signed and Sealed this

Thirteenth Day of August, 2002

Attest:

Attesting Officer

JAMES E. ROGAN
*Director of the United States Patent and Trademark Office*